US010923386B2

(12) United States Patent
Samir (10) Patent No.: US 10,923,386 B2
(45) Date of Patent: Feb. 16, 2021

(54) PROCESSING CHAMBER (71) Applicant: Applied Materials, Inc., Santa Clara, CA (US)

(72) Inventor: Mehmet Tugrul Samir, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 807 days.

(21) Appl. No.: 14/969,444

(22) Filed: Dec. 15, 2015

(65) Prior Publication Data

US 2016/0197001 A1 Jul. 7, 2016

Related U.S. Application Data

(60) Provisional application No. 62/105,906, filed on Jan. 21, 2015, provisional application No. 62/099,264, filed on Jan. 2, 2015.

(51) Int. Cl.
*H01L 21/687* (2006.01)
*C23C 16/455* (2006.01)
(Continued)

(52) U.S. Cl.
CPC ........ *H01L 21/68785* (2013.01); *C23C 16/44* (2013.01); *C23C 16/4558* (2013.01);
(Continued)

(58) Field of Classification Search
CPC .......... C23C 16/45508; C23C 16/4558; C23C 16/4584; C23C 16/481–483
See application file for complete search history.

(56) References Cited

U.S. PATENT DOCUMENTS 5,288,684 A * 2/1994 Yamazaki ............. C23C 16/482
118/719
5,468,299 A * 11/1995 Tsai .................... C23C 16/4584
108/138
(Continued)

FOREIGN PATENT DOCUMENTS

CN 101469411 A 7/2009
CN 102230167 A 11/2011
(Continued)

OTHER PUBLICATIONS

International Search Report and Written Opinion for Application No. PCT/US2015/062390 dated Mar. 10, 2016; 10 pages.
(Continued)

*Primary Examiner* — Dah-Wei D. Yuan
*Assistant Examiner* — Stephen A Kitt
(74) *Attorney, Agent, or Firm* — Patterson + Sheridan, LLP (57) ABSTRACT

Embodiments of the present disclosure provide a processing chamber with a top, a bottom, and a sidewall coupled together to define an enclosure, a gas distributor around the sidewall, a substrate support disposed in the enclosure, the substrate support having a central opening and a plurality of substrate locations distributed around the central opening, a pumping port below the substrate support, and an energy source coupled to the top or the bottom. The energy source may be a radiant source, a thermal source, a UV source, or a plasma source. The substrate support may be rotated using a magnetic rotator and an air bearing. The gas distributor may have a plurality of passages distributed around a circumference of the gas distributor.

6 Claims, 7 Drawing Sheets

(51) Int. Cl.
*H01L 21/67* (2006.01)
*C23C 16/50* (2006.01)
*C23C 16/458* (2006.01)
*C23C 16/48* (2006.01)
*C23C 16/44* (2006.01)

(52) U.S. Cl.
CPC .... *C23C 16/4584* (2013.01); *C23C 16/45508* (2013.01); *C23C 16/45574* (2013.01); *C23C 16/481* (2013.01); *C23C 16/50* (2013.01); *H01L 21/67115* (2013.01); *H01L 21/68742* (2013.01); *H01L 21/68764* (2013.01); *H01L 21/68771* (2013.01)

(56) References Cited

U.S. PATENT DOCUMENTS

| | | | |
|---|---|---|---|
| 5,672,204 A * | 9/1997 | Habuka | C30B 25/14 117/204 |
| 6,121,581 A * | 9/2000 | Hegedus | C23C 16/481 118/50.1 |
| 7,378,618 B1 * | 5/2008 | Sorabji | C30B 31/14 118/50.1 |
| 2009/0165713 A1 * | 7/2009 | Kim | C23C 16/4412 118/719 |
| 2010/0200545 A1 * | 8/2010 | Koelmel | C23C 16/4584 216/58 |
| 2010/0316800 A1 | 12/2010 | Chang et al. | |
| 2011/0232569 A1 * | 9/2011 | Olgado | C23C 16/54 118/719 |
| 2013/0087093 A1 | 4/2013 | Olgado et al. | |
| 2013/0210238 A1 | 8/2013 | Yudovsky | |
| 2014/0199056 A1 * | 7/2014 | Chang | H01L 21/67115 392/416 |
| 2014/0263268 A1 | 9/2014 | Cong et al. | |

FOREIGN PATENT DOCUMENTS

| | | |
|---|---|---|
| CN | 102439710 A | 5/2012 |
| CN | 103493185 A | 1/2014 |
| KR | 20050022911 A | 3/2005 |
| TW | 459276 B | 10/2001 |
| TW | 201041078 A | 11/2010 |
| TW | 201432103 A | 8/2014 |
| TW | 201443275 A | 11/2014 |
| TW | 201500569 A | 1/2015 |

OTHER PUBLICATIONS

Chinese Office Action for Application No. 201580064762.0 dated Jan. 21, 2019.
Chinese Office Action for Application No. 201580064762.0 dated Aug. 22, 2019.
Taiwan Office Action for Application No. 104142743 dated Jun. 27, 2019.

* cited by examiner

PROCESSING CHAMBER

CROSS-REFERENCE TO RELATED APPLICATIONS

This application claims benefit of U.S. Provisional Patent Application Ser. No. 62/099,264, filed Jan. 2, 2015 and U.S. Provisional Patent Application Ser. No. 62/105,906, filed Jan. 21, 2015, both applications are hereby incorporated by reference herein.

FIELD

Embodiments of the present disclosure generally relate to methods and apparatus for semiconductor processing. More specifically, embodiments described herein relate to methods and apparatus for performing atomic layer epitaxy.

BACKGROUND

Epitaxy is a process that involves chemical addition of material to a surface in layers. Such processes are common in semiconductor processing, where they are used for building certain components of logic and memory devices. In a typical process for making a logic device, a silicon layer is grown epitaxially on a substrate to provide ordered crystal structure. This silicon layer typically becomes the channel component of the transistor.

Epitaxy is a slow process. In today's most advanced manufacturing facilities, an epitaxy process typically takes about an hour to process a 300 mm circular substrate. There is a need to increase throughput in epitaxy processes.

SUMMARY

Embodiments of the present disclosure provide a processing chamber with a top, a bottom, and a sidewall coupled together to define an enclosure, a gas distributor around the sidewall, a substrate support disposed in the enclosure, the substrate support having a central opening and a plurality of substrate locations distributed around the central opening, a pumping port below the substrate support, and an energy source coupled to the top or the bottom. The energy source may be a radiant source, a thermal source, a UV source, or a plasma source. The substrate support may be rotated using a magnetic rotator and an air bearing. The gas distributor may have a plurality of passages distributed around a circumference of the gas distributor.

Also disclosed is a processing chamber with a top, a bottom, and a sidewall coupled together to define an enclosure, a gas distributor around the sidewall, a substrate support disposed in the enclosure, the substrate support having a central opening, a plurality of substrate locations distributed around the central opening, and a magnetic stator, a pumping port below the substrate support, and an energy source coupled to the top or the bottom.

Also disclosed is a processing chamber with a top, a bottom, and a sidewall coupled together to define an enclosure; a magnetic rotor disposed in an annular enclosure along the bottom; an annular air bearing disposed on the annular enclosure; a gas conduit coupled to an inner radius of the air bearing, the gas conduit extending from the inner radius of the air bearing toward a central axis of the process chamber and through the bottom; an exhaust port in the bottom; a pumping plenum around the sidewall coupled to a pumping port in the sidewall; a substrate support comprising an upper surface defining a processing plane, the upper surface having a plurality of substrate locations, an exhaust formed through a central region of the upper surface, a substrate support sidewall extending around a periphery of the upper surface and away from the processing plane, the substrate support sidewall having a plurality of vents and coupled to the upper surface at a first end, and an annular magnetic stator coupled to a second end of the substrate support sidewall opposite the first end, the annular magnetic stator having a support surface that faces a gas exit surface of the air bearing and a baffle that extends around the air bearing, the magnetic stator, the substrate support sidewall, and upper surface defining a gas exhaust pathway from the exhaust of the upper surface through the vents to the pumping plenum; a ledge coupled to the sidewall above the pumping plenum; a recess formed in the sidewall above the ledge; a cylindrical, removable, gas distributor on the ledge against the recess and together with the recess defining a gas plenum, the gas distributor having a plurality of passages formed therethrough, the passages distributed around a circumference of the gas distributor and along an axis of the gas distributor, the substrate support, gas distributor, and top together defining a process volume fluidly connected to the gas plenum by the passages; and an energy source coupled to the top.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In this disclosure, the terms "top", "bottom", "side", "above", "below", "up", "down", "upward", "downward", "horizontal", "vertical", and the like do not refer to absolute directions. Instead, these terms refer to directions relative to a basis plane of the chamber, for example a plane parallel to a substrate processing surface of the chamber.

Figure 1:
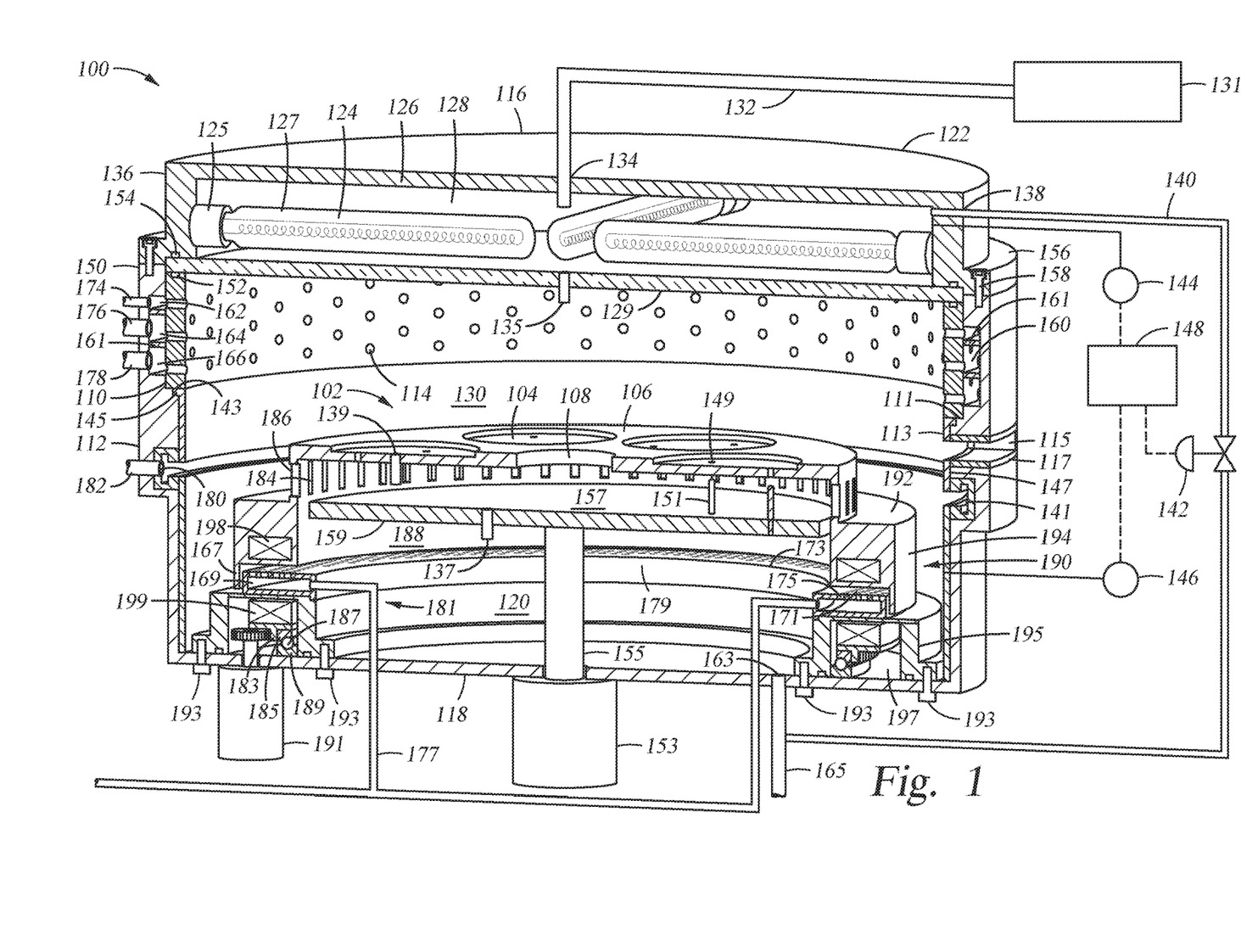
FIG. 1 is a perspective cross-sectional view of a processing chamber according to one embodiment.

FIG. 1 is a perspective cross-sectional view of a processing chamber 100 according to one embodiment. The processing chamber 100 generally features a substrate support 102 having multiple substrate locations 104 on a processing surface 106 thereof, the substrate support 102 having a central opening 108 that provides uniform gas flow and exposure across the processing surface 106. The processing chamber 100 also generally features a gas distributor 110 around a sidewall 112 of the processing chamber 100, the gas distributor 110 having a plurality of gas passages 114 distributed around a circumference of the gas distributor 110 and along an axis of the gas distributor 110.

The chamber 100 has a top 116 and a bottom 118 that, together with the sidewall 112, define a volume 120 of the processing chamber 100. The substrate support 102 is disposed within the volume 120. Coupled at the top 116 of the processing chamber 100 is an energy source 122 that projects energy into the volume 120 toward the substrate support 102. The energy source 122 may be a radiant source, a thermal source, or a plasma source. Radiant sources may include UV, IR, and visible frequency lamps, lasers, and LED's, or combinations thereof. Thermal sources may be lasers, LED's, and filament lamps, or combinations thereof. Plasma sources may be capacitive, inductive, or a combination thereof. The processing chamber 100 is shown with an energy source 122 that has a plurality of lamps 124. In this case, the lamps 124 are arranged along a plane generally parallel to the processing surface 106 and oriented radially, each lamp 124 having a power connection 125 at a periphery of the energy source 122 and a radiant emitter 127 extending along a radius of the energy source 122 toward a center thereof. Processing chambers with other kinds of energy sources are described below. It should be noted that the energy source 122, or any energy source, may also be coupled to the chamber 100 at the bottom 118. Such an embodiment is described below in connection with FIG. 5.

The lamps 124 may be oriented in any convenient way. The lamps 124 may be oriented in rows, for example, or columns. If higher power density is desired, multiple layers of lamps may be oriented in rows or columns. Alternately, lamps may be oriented vertically, with power connections pointed toward the top of the chamber and emitters pointed toward the processing surface 106. The energy source may have reflective internal surfaces to increase the efficiency of power delivery to the processing surface 106. In an embodiment with vertically oriented lamps, each lamp may be disposed in a reflective tube to maximize power delivery from each lamp.

If desired, power delivery may be attenuated in a central region of the energy source to avoid radiating excessive power through the central opening 108 of the substrate support 102. Radially oriented linear lamps may be specified with a length that is a fraction of the radius of the energy source 122, such that the radiant emission of the lamps does not extend to the center of the chamber 100. Other lamp arrangements may be selected to provide an annular radiant energy pattern toward the substrate support 102. In some cases, the energy source 122 may be annular. An example of an annular energy source is described below in connection with FIG. 5.

The energy source 122 generally comprises an enclosure 126 that forms an energy chamber 128 for energy emission, in the case of lamps, or application, in the case of inductive plasma. A divider 129 may separate the energy source 122 from the volume 120 adjacent to the processing surface 106. The divider 129 and the processing surface 106 together define a processing region 130. The divider 129 may be a thermally resistant material, such as quartz, and may be transparent to energy emitted in the energy chamber 128 to transmit the energy into the processing region 130. The divider 129 may be a barrier to gas flow between the energy chamber 128 and the processing region 130, or the divider 129 may have passages to allow gas flow between the energy chamber 128 and the processing region 130. In a radiant energy embodiment such as the embodiment of FIG. 1, the divider 129 is a barrier to gas flow, but in an inductive plasma embodiment, the divider 129 may allow plasma to flow from the energy chamber 128 to the processing region 130 through passages. In an inductive plasma embodiment, the divider 129 may be a bias member, for example a grid or perforated plate, which can be energized with an electrical bias to encourage ions from the plasma to flow into the processing region 130.

In the embodiment of FIG. 1, an inert gas may be provided from a gas source 131 to the energy chamber 128 through a gas conduit 132 and a portal 134 into the energy chamber 128. The portal 134 may be formed in the top 116 or in a sidewall 136 of the energy chamber 128. An exhaust portal 138 may be formed in the top 116 or the sidewall 136, and may be coupled to a vacuum source (not shown) by an energy chamber exhaust conduit 140. The inert gas may be provided for cooling of radiant emitters 127 in the energy chamber 128, for cooling the divider 129 to prevent unwanted deposition on a process-facing surface of the divider 129, and to provide pressure control for the energy chamber 128 to prevent damage to the divider 129. A pressure regulator 142 may be disposed in the energy chamber exhaust conduit 140 to regulate pressure in the energy chamber 128. A first pressure sensor 144 may be used to monitor pressure in the energy chamber 128. A second pressure sensor 146 may monitor pressure in the processing region 130. A controller 148 may control the pressure regulator 142 to maintain pressure in the energy chamber 128 slightly above the pressure in the processing region 130 to prevent processing gases from intruding into the energy chamber 128.

The divider 129 is positioned between an upper end 150 of the sidewall 112 and the top 116. A first seal 152 may be disposed between the divider 129 and the sidewall 112. A second seal 154 may be disposed between the divider 129 and the top 116. The top 116 may have a peripheral portion 156 that contacts the upper end 150 of the sidewall 112. The peripheral portion 156 may be fastened to the sidewall 112 by one or more fasteners 158, for example bolts or screws. The fasteners 158 may provide a sealing force on the seals 152, 154. The divider 129 is generally transparent or transmissive to selected emissions of the radiant emitters 127 to allow energy from the emitters 127 to enter the processing region 130 for processing of substrates.

Interior surfaces of the energy chamber 128, with the exception of the surface of the divider 129, may be lined or coated with a reflective material if desired. The reflective material may be any reflective material capable of withstanding the environment of the energy chamber 128. Cooling gas flow may be selected to maintain a temperature of the interior surfaces of the energy chamber 128 at a desired level to avoid damage to the interior surfaces. Reflective materials that may be used include gold, silver, or other metals, and dielectric reflectors. The surface of the divider 129 facing the energy chamber 128 may be coated with an anti-reflective material, if desired.

The gas distributor 110 is disposed around a periphery of the processing region 130 adjacent to the sidewall 112. A first gas plenum 160 may be formed in the sidewall 112 adjacent to the gas distributor 110 to provide uniform gas distribution around the gas distributor 110. The plurality of gas passages 114 formed in the gas distributor provides fluid connection between the first gas plenum 160 and the processing region 130. The gas distributor 110 may be a thermally resistant material and/or a chemically resistant material. For a thermal process such as epitaxy, the gas distributor 110 may be made of quartz, sapphire, a combination of quartz and sapphire, or another thermally resistant and chemically resistant material. For a plasma process, the gas distributor 110 may be made of, or coated with, a plasma resistant material such as yttria or another ceramic material. The gas distributor 110 may rest on a ledge 111 and a ledge 143 extending radially inward from the sidewall 112. A chamber liner 113 may also be disposed along the ledge 111. A slit valve 115 may be formed in the sidewall 112 to provide passage for substrates into and out of the chamber 100. The slit valve 115 may also have a liner 117. The liners 113 and 117 may be quartz, sapphire, or any thermally resistant and chemically resistant material.

The gas passages 114 may be arranged according to any convenient arrangement to provide uniform gas exposure to the substrates on the substrate support 102. In the embodiment of FIG. 1, the gas passages 114 are arranged in five rows of uniformly spaced passages staggered by half-pitch. The first gas plenum 160 may be divided into a plurality of zones by one or more dividers 161 to provide flow selectability, if desired. In the embodiment of FIG. 1, the first gas plenum 160 has a first zone 162, a second zone 164, and a third zone 166. The dividers 161 of the first gas plenum 160 are horizontal annular walls disposed through the first gas plenum 160 around the circumference of the sidewall 112. Each divider 161 extends from the sidewall 112 across the first gas plenum 160 to the gas distributor 110. If desired, one or more recesses (not shown) may be formed in the gas distributor 110 to receive the dividers 161, thus providing improved isolation between the zones 162, 164, and 166. Individual gas conduits may provide selectable gases to the zones 162, 164, 166 of the gas inlet plenum. A first gas conduit 174 may be coupled to the first zone 162, a second gas conduit 176 may be coupled to the second zone 164, and a third gas conduit 178 may be coupled to the third zone 166. Each gas conduit 174, 176, 178 may provide a selected gas or gas mixture that may be reactive or inert according to the needs of a particular process. A gas conduit such as the gas conduits 174, 176, 178 is provided for each separate zone, such as the zones 162, 164, and 166. In the event the gas plenum 160 has only one zone, with no dividers 161, only one conduit is provided. The gas plenum 160 may thus be used for gas input to the chamber 100 or for gas exhaust from the chamber 100, depending on the needs of specific processes.

A second gas plenum 180 is formed in the sidewall 112, and a vacuum source (not shown) may be coupled to the second gas plenum 180 by a gas conduit 182, which in the embodiment of FIG. 1 is a fourth gas conduit. Process gases may flow through one or more of the conduits 174, 176, 178 into the gas plenum 160, through the gas passages 114, and toward the substrate support 102. Substrates disposed on the substrate locations 104 of the substrate support 102 are exposed to the process gases, which flow along the processing surface 106 of the substrate support 102 and through the opening 108. One or more vents 184 may be provided in a sidewall 186 of the substrate support 102 to provide an exit pathway for gas flowing through the opening 108. Gas can then flow into an interior 188 of the substrate support 102, through the vents 184, into the second gas plenum 180, and out through the gas conduit 182.

Interior surfaces of the chamber 100 may be lined. A lower liner 147 may be disposed along the sidewall 112. The lower liner 147 may have a lip 145 that rests on the ledge 111 of the sidewall 112. The lower liner 147 may extend from the ledge 111 to the bottom 118 of the chamber 100. In one aspect, the lower liner 147 may be two pieces, a first piece that is cylindrical and is disposed along the sidewall 112 at the bottom of the chamber 100, and a second piece that has the lip 145 resting on the ledge 111. A gap between the two pieces may allow gas to flow between the processing region 130 and the second gas plenum 180. In another aspect, the lower liner 147 may be one piece that extends from the ledge 111 to the bottom of the chamber, with openings in the lower liner 147 to allow gas to flow between the processing region 130 and the second gas plenum 180. A plenum liner 141 may be disposed in the second gas plenum 180, as well. The liners 147, 117, and 141 may be made from a thermally resistant and chemically resistant material, such as quartz, sapphire, or a combination thereof. The lower liner 147 may have a thickness from about 3 mm to about 10 mm, for example about 5 mm. The plenum line 141 may have a thickness between about 1 mm and about 5 mm, for example about 2 mm.

The substrate support 102 is rotatable, and may be rotated by a rotation assembly 190, when the rotation assembly 190 is energized. The rotation assembly 190 is formed at a lower portion 192 of the substrate support 102. The lower portion 192 extends downward from the substrate support sidewall 186 below the vents 184, and a shoulder 194 of the lower portion 192 may be provided to direct gas flow toward the second gas plenum 180, if desired.

The rotation assembly 190 may be magnetically actuated, and may be supported by an air bearing support. The substrate support 102 of FIG. 1 has a magnetic stator 198 disposed in the lower portion 192. The magnetic stator 198 may be a plurality of magnets oriented in an annular ring around the circumference of the substrate support 102 inside the lower portion 192. The lower portion 192 and the sidewall 186 together form an annular enclosure that defines the interior 188 of the substrate support 102 below the processing surface 106. The magnetic stator 198 is positioned to magnetically couple with a magnetic rotor 199 disposed in a magnet enclosure 197 defined by a containment ring 195. The containment ring 195 is an annular member that may be attached to the bottom 118 by one or more fasteners 193, such as bolts or screws. The magnetic rotor 199 may be actuated by a mechanical rotor 191 that protrudes through the bottom 118 and couples to the magnetic rotor 199 inside the magnet enclosure 197. The magnetic rotor 199 may be supported by a bearing 189, which may be a ball-bearing track, comprising one or more bearing members 187. The magnetic rotor 199 may include a recess 185 that receives the one or more bearing member 187. The magnetic rotor 199 may also include a drive surface 183 that couples to the mechanical rotor 191 to provide rotation for the magnetic rotor 199. Magnetic coupling of the magnetic rotor 199 and the magnetic stator 198 transmits rotational motion from the magnetic rotor 199 to the substrate support 102.

The substrate support 102 may be prevented from contacting the containment ring 195 during rotational processing by an air bearing 181. The air bearing 181 may have more than one configuration. Three different configurations of an air bearing are described herein. The air bearing 181 of FIG. 1 is one configuration. The air bearing 181 comprises an air bearing ring 179 disposed between the lower portion 190 of the substrate support 102 and the containment ring 195. The air bearing 181 also comprises one or more gas conduits 177 coupled to the air bearing ring 179 to provide gas to the air bearing ring 179. The gas conduits 177 may be coupled to a common gas supply, as shown in FIG. 1. A plurality of holes 175 are formed in a surface 173 of the air bearing ring 179 facing a float surface 171 of the lower portion 190 of the substrate support 102. Gas from the gas conduit 177 flows into an interior 169 of the air bearing ring 179, and distributes through the interior 169 of the air bearing ring 179 around a circumference of the air bearing ring 179. The gas flows through the holes 175 and provides a separation force against the float surface 171 of the substrate support 102. When operating, the substrate support 102 thus floats on a gas cushion between the air bearing ring 179 and the float surface 171. A skirt 167 extends from the float surface 171 beside the air bearing ring 179 to provide a restricted flow path for gas flowing radially outward from the air bearing ring 179. The restricted flow path in the outward radial direction encourages the air bearing gas to flow radially inward to the interior 188 of the substrate support 102. A vacuum source may be coupled to the interior 188 of the substrate support 102 through an air bearing exhaust conduit 165 and portal 163 to remove the air bearing gas. Removing the air bearing gas through the interior 188 of the substrate support 102 may prevent large flows of gas into the second gas plenum 180 from complicating pressure control in the processing region 130. The energy chamber exhaust conduit 140 may be coupled to the air bearing exhaust conduit 165, if desired, to utilize one vacuum source for both utility gases, with appropriate valving to provide pressure balance.

A reflector 159 may be disposed in the interior 188 of the substrate support 102 to reflect any radiation that propagates through the opening 108, or is transmitted or radiated by the substrates or the substrate support 102, back toward the support surface 106 of the substrate support 102. The reflector 159 may have a reflective member 157 and a support member 155. The support member 155 may be coupled to the bottom 118 of the chamber 100, or may extend through the bottom 118 to an optional actuator 153, which may extend or retract the reflective member 157 as desired.

The reflector 159 may include one or more lift pins 151 extending from the reflective member 157 toward the support surface 106 of the substrate support 102. Each of the one or more lift pins 151 may be disposed in registration with an opening 149 in a substrate location 104 so that when the substrate support 102 moves axially relative to the reflector 159, and the lift pins 151, the lift pins 151 may protrude through the openings 149 to contact a substrate disposed in the substrate location 104 and separate the substrate from the substrate support 102. A robot blade (not shown) may then extend through the slit valve 115 to retrieve the substrate and remove the substrate from the chamber 100. A substrate may also be deposited on the extended lift pins 151, which can then retract to position the substrate in the substrate location 104. In one aspect, the lift pins 151 may extend and retract through the openings 149 by movement of the substrate support 102 on the air bearing 181. The air bearing 181 may be deactivated so that the substrate support 102 rests on the air bearing ring 179. If dimensions of the lift pins 151 are selected appropriately, the lift pins 151 may then protrude through the openings 149 to provide substrate transportation. When the air bearing 181 is then activated, the substrate support 102 may move into contact with the substrate, and the lift pins 151 may retract below the support surface 106. The substrate support 102 is then in a processing position and may freely rotate without contacting the lift pins 151. In another aspect, the reflector 159 may be actuated to extend and retract the lift pins 151 as desired.

The chamber 100 may be assembled from the bottom up. The mechanical actuator 191 may be disposed through the bottom 118, and the bearing 189 placed in position. The magnetic rotor 199 may be disposed on the bearing 189, and the containment ring 195 may then be fastened in place. The air bearing ring 179 may be positioned on the containment ring 195 and the conduits 177 may be coupled to the air bearing ring 179. The reflector 159 may then be disposed in place, and the substrate support 102 disposed on the air bearing ring 179. The lower liner 147 and the plenum liner 141 may be disposed in place, the gas distributor 110 may then be inserted, the divider 129 placed over the gas distributor 110, and then the top 116 may be fastened into place to close the chamber 100. Gases, vacuum, and power may then be coupled to the various portals and connections on the outside of the chamber 100.

Temperature sensors, such as pyrometers, may be disposed in various locations in the chamber 100 to monitor various temperatures that may be significant for particular processes. A first temperature sensor 139 may be disposed in and/or through one or more of the substrate locations 104 to allow the temperature sensor 139 unlimited access to the substrate for monitoring a temperature of the substrate. If the substrate support 102 is rotated, the first temperature sensor 139 may have wireless power and data transmission. A second temperature sensor 137 may be disposed in, on, or through the reflective member 157 to view a underside of the substrate support surface 106 to monitor a temperature of the substrate support surface 106. A third temperature sensor 135 may be disposed in, on, or through the divider 129 to view substrates disposed in the substrate locations 104 and/or the substrate support surface 106 to monitor temperatures of those components. The second and third temperature sensors 137, 135 may be wired or wireless.

Figure 2A:
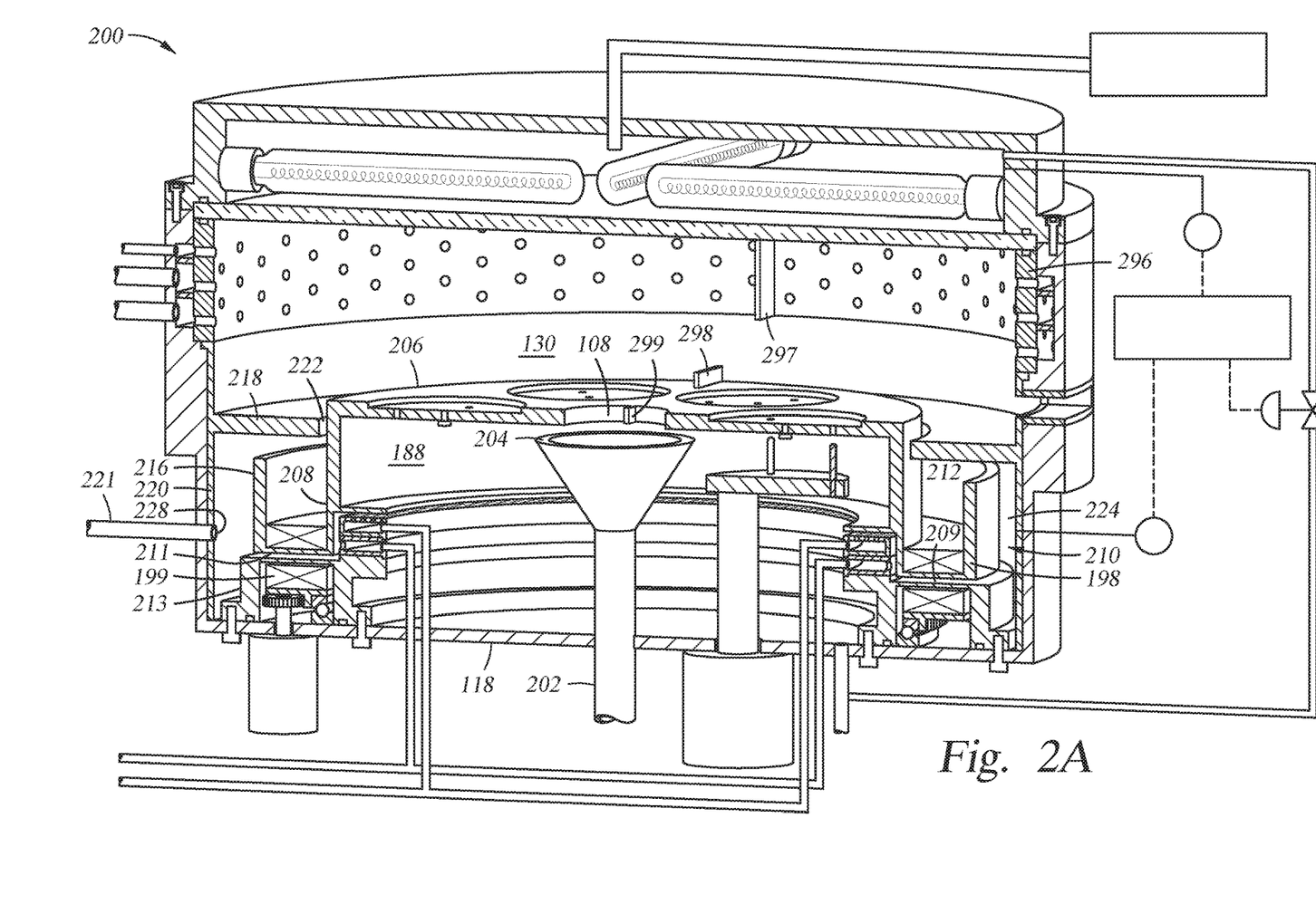
FIG. 2A is a perspective cross-sectional view of a gas distributor according to one embodiment.

FIG. 2A is a perspective cross-sectional view of a processing chamber 200 according to another embodiment. The chamber 200 is a multi-substrate processing chamber, like the chamber 100 of FIG. 1, with many similarities and a few differences. The chief differences of the chamber 200 from the chamber 100 are in gas flow, air bearing configuration, and rotational drive configuration. The chamber 200 also has a gas distributor 296 that is different from the gas distributor 110 of the chamber 100 by inclusion of a flow feature described further below.

The chamber 200 has a central gas flow configuration, rather than the annular gas flow arrangement of the chamber 100. A central conduit 202 is provided through the bottom 118 of the chamber with an end 204 proximate to the opening 108. Gas may flow through the central conduit 202 and through the opening 108, rather than through openings in the substrate support sidewall. The chamber 200 thus has a substrate support 206 that has a solid sidewall 208, rather than a sidewall with openings as in the chamber 100. The gas flow pattern of the chamber 200 exposes the interior 188 of the substrate support 206 less to process gases, which may reduce unwanted deposition on the interior surfaces of the substrate support 206.

The substrate support 206 has a rotational drive 210 that is magnetic, like the rotational drive 190 of the chamber 100, but the magnetic stator 198 is a separate piece disposed in an open channel 212 formed around the sidewall 208. The channel 212 has a bottom 214, on which the magnetic stator 198 rests, and an outer wall 216. The magnetic stator 198 is positioned closer to the magnetic rotor 199 in the chamber 200 by moving the air bearing to the interior 188 of the substrate support 206. A minimal gap 209 is maintained between a lower portion 211 of the substrate support 206 and a containment ring 213 for the magnetic rotor 199. Thus, closer magnetic coupling may be achieved in the rotational drive 210.

The channel 212 may be shielded from process gases in the processing region 130 by a cover 218, which is shown in FIG. 2A as a radial extension of a lower liner 220. The cover 218 of FIG. 2A extends radially inward from the lower liner 220 toward the sidewall 208, forming a small gap 222 with the sidewall 208. The cover 218, sidewall 208, lower liner 220, containment ring 213, and chamber bottom 118 together define a rotational drive chamber 224. A gas purge may be coupled to the rotational drive chamber 224 by purge conduit 226 and portal 228 to flow a purge gas through the rotational drive chamber 224 through the gap 222. The purge gas flow may prevent intrusion of process gases from the processing region 130 through the gap 222 into the rotational drive chamber 224. This may protect the magnetic stator from chemical attack by process gases.

Figure 2B:
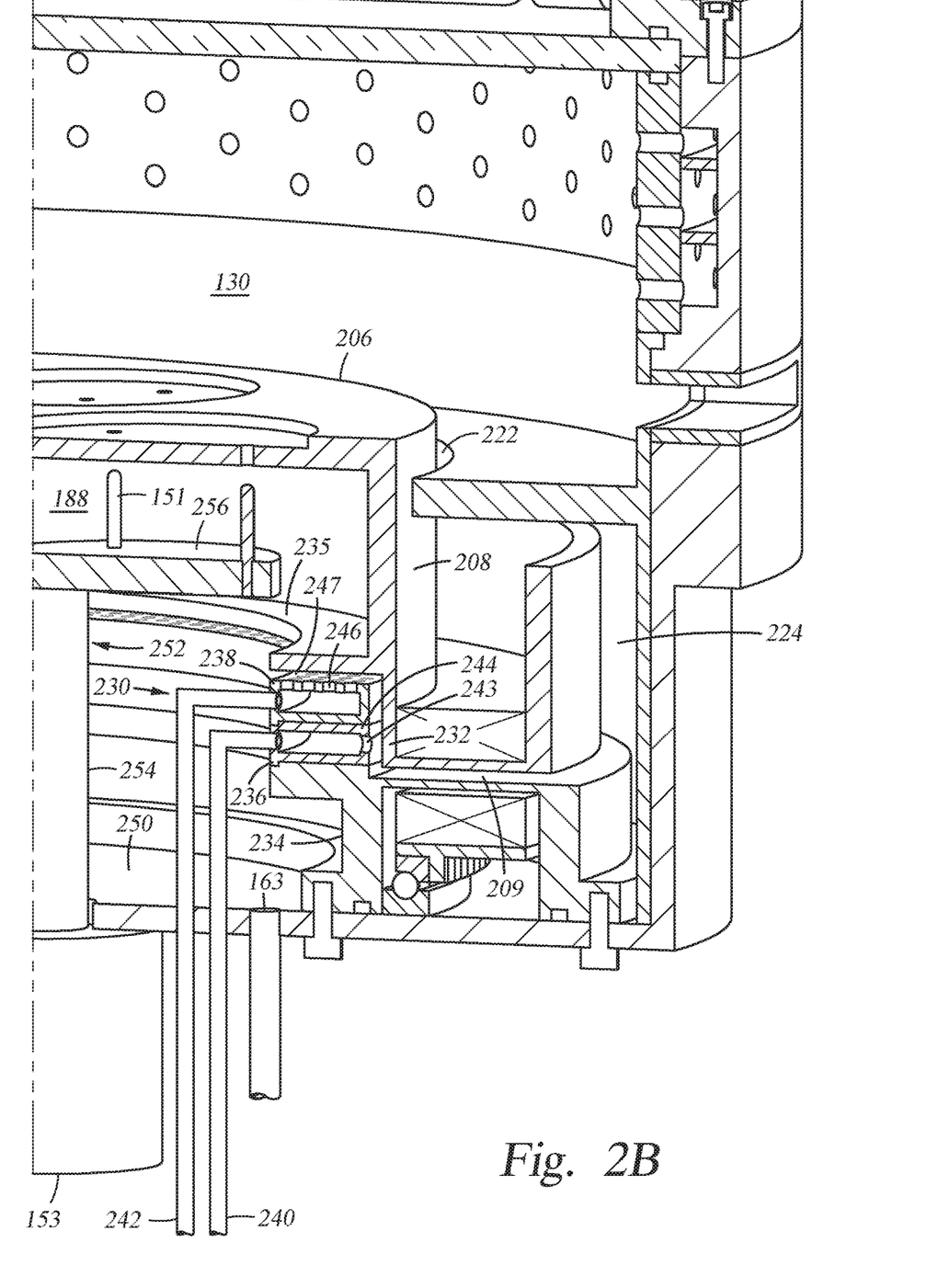
FIG. 2B is a detailed view of a portion of the chamber of FIG. 2A.

FIG. 2B is a detailed view of a portion of the chamber 200 of FIG. 2A. An air bearing 230 is located along an inner radius 232 of the substrate support 206. The air bearing 230 is disposed between an extension 234 of the containment ring 213 that extends radially inward from the containment ring 213 and a ledge 235 extending radially inward from the sidewall 208 of the substrate support 206. The ledge 235 may be a separate piece, or may be integral with the substrate support 206. The air bearing 230 comprises a first air bearing ring 236 and a second air bearing ring 238. The first air bearing ring 236 is a centering bearing, while the second air bearing ring 238 is a float bearing. The second air bearing ring 238 is disposed on the first air bearing ring 236 in FIGS. 2A and 2B.

A first air bearing gas source 240 is coupled to the first air bearing ring 236, and a second air bearing gas source 242 is coupled to the second air bearing ring 238. The two gas sources 240, 242 offer independent control of center bearing thrust and float bearing thrust. A common gas source may also be used. The first air bearing ring 236 has a plurality of openings 243 along an outer radius 244 of the first air bearing ring 236 to direct gas toward the sidewall 208. The gas flow from the first air bearing ring 236 creates a gas cushion between the sidewall 208 and the air bearing rings 236, 238, thus providing centering for the substrate support 206 during operation. The second air bearing ring 238 has a plurality of openings 246 in a float surface 247 of the second air bearing ring 238 facing the ledge 235. The gas flow from the second air bearing ring 238 creates a gas cushion between the second air bearing ring 238 and the ledge 235 to prevent contact between the substrate support 206 and the second air bearing ring 238 during operation. Gas from the two air bearing rings 236, 238 may flow between the second air bearing ring 238 and the ledge 235 into the interior 188 of the substrate support 206 and out through the portal 163. Gas may also flow between the sidewall 208 and the first air bearing ring 236, through the gap 209, into the rotational drive chamber 224, and through the gap 222 into the processing region 130. Gas in the processing region 130 may flow through the opening 108 in the substrate support 206 and out through the conduit 202 (FIG. 2A). Alternately, process gases may flow into the chamber 200 through the conduit 202 and the end 204, through the opening 108 into the processing region 130, and then out through the gas distributor 110 and the first gas plenum 160.

The chamber 200 does not have the reflector 159 of the chamber 100. Instead, the bottom 118 of the chamber 200 may have a reflective inner surface 250, which may be a reflective coating or a reflective liner, disposed generally inside the inner radius of the containment ring 213. The inner radius of the containment ring 213 may also be coated or lined with reflective material. The lift pins 151 are disposed on a lift pin assembly 252 that comprises an axial support 254 and a lateral support 256. The axial support 254 may be coupled to the bottom 118, or through the bottom 118 to the actuator 153.

Referring again to FIG. 2A, the chamber 200 may include optional flow features to direct gas flow in desired ways. FIG. 2A illustrates three schematic flow features. A first flow feature 297 is provided on the gas distributor 296. The first flow feature 297 may be shaped, curved, oriented, and/or contoured in any desired way to provide an advantageous gas flow pattern in the chamber 200. The first flow feature 297 may be integral with the gas distributor 296 or attached to the gas distributor 296. The first flow feature 297 may be the same material as the gas distributor 296, or a different material.

The substrate support 206 may have a second flow feature 298 and a third flow feature 299. The second flow feature 298 is shown schematically disposed on the substrate support surface 106. A third flow feature 299 is shown schematically disposed in the central opening 108 of the substrate support 206. The second and third flow features 298, 299, may likewise be shaped, curved, oriented, and/or contoured in any desired way to provide an advantageous gas flow pattern. The second and third flow features 298, 299 may be integral with the substrate support 206, or attached to the substrate support 206, and may be the same material as the substrate support 206, or a different material. One of each flow features 297, 298, 299, is shown, but any number of each flow feature may be provided.

Figure 3:
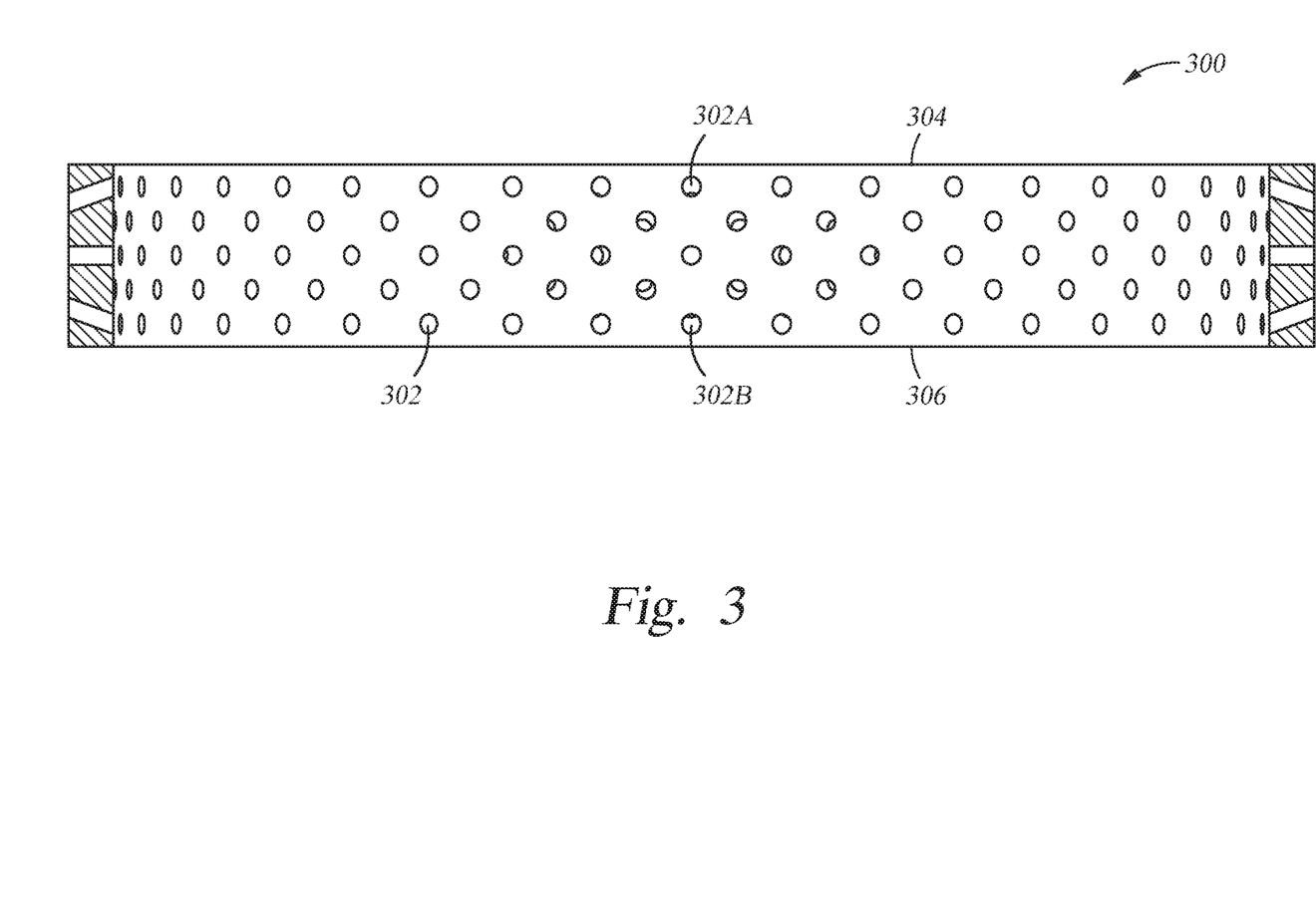
FIG. 3 is a cross-sectional view of the inside surface of a gas distributor according to one embodiment.

FIG. 3 is a cross-sectional view of the inside surface of a gas distributor 300 according to one embodiment. The gas distributor 300 may be used as the gas distributor 110 in either of the chambers 100 or 200. The gas distributor 300 has a plurality of passages 302 for flowing gas through the gas distributor 300. The passages 302 are angled to direct gas in a desired direction. In the embodiment of FIG. 3, the passages 302 that form a top row 302A around the circumference of the gas distributor 300 are angled toward the top edge 304 of the gas distributor 300, while the passages 302 that form a bottom row 302B around the circumference of the gas distributor 300 are angled toward the bottom edge 306 of the gas distributor 300.

The passages 302 may be angled in any desired direction to produce a directional gas flow. If the gas distributor 300 were used in either of the chambers 100 or 200, with the dividers 161 disposed in the first gas plenum 160, the top row 302A of passages 302 may be used to provide an inert gas to the process chamber as a flush gas to prevent deposition on the divider 129. In such an embodiment, the flush gas would flow toward the divider 129, along the divider 129 toward a central axis of the chamber 100 or 200, and then through the opening 108 to exit the chamber. Such a gas flow pattern would also create a flow envelope to direct reactive gases toward the substrate support surface 106, and any substrate disposed thereon in the substrate locations 104. Any number of openings, and any number of rows of passages 302 or passages 114, may be provided in a gas distributor such as the gas distributor 300. The gas distributor 300 has 97 visible passages 302, so the entire gas distributor 300 would have 190 total passages 302, in five rows. The passages 302 (or 114) may be arranged in one row, two rows, three rows, four rows, or any number of rows above five rows, as needed for particular implementations. The gas distributor 300 (and the gas distributor 110) has a constant density of the passages 302, but may have a varying density if desired. The passages 302 may be sized, depending on the total number of passages 302, to provide a desired gas flow. The passages 302 may have diameter between about 2 mm and about 2 cm, such as between about 5 mm and about 1 cm, for example about 7 mm.

As noted above, the gas distributor 300 may be made of a thermally resistant and chemically resistant material, such as quartz, sapphire, or a combination of the two. The gas distributor 300, and the gas distributor 110, or any of the gas distributors described herein, may be made of an opaque material such as bubble quartz, if desired, to prevent heating of gases before they exit the passages 302. Alternately, the inner radius of the gas distributor 300 (or the other gas distributors described herein) may be coated with a reflective, refractory, or non-transmissive material, such as gold or a dielectric reflector.

Figure 4:
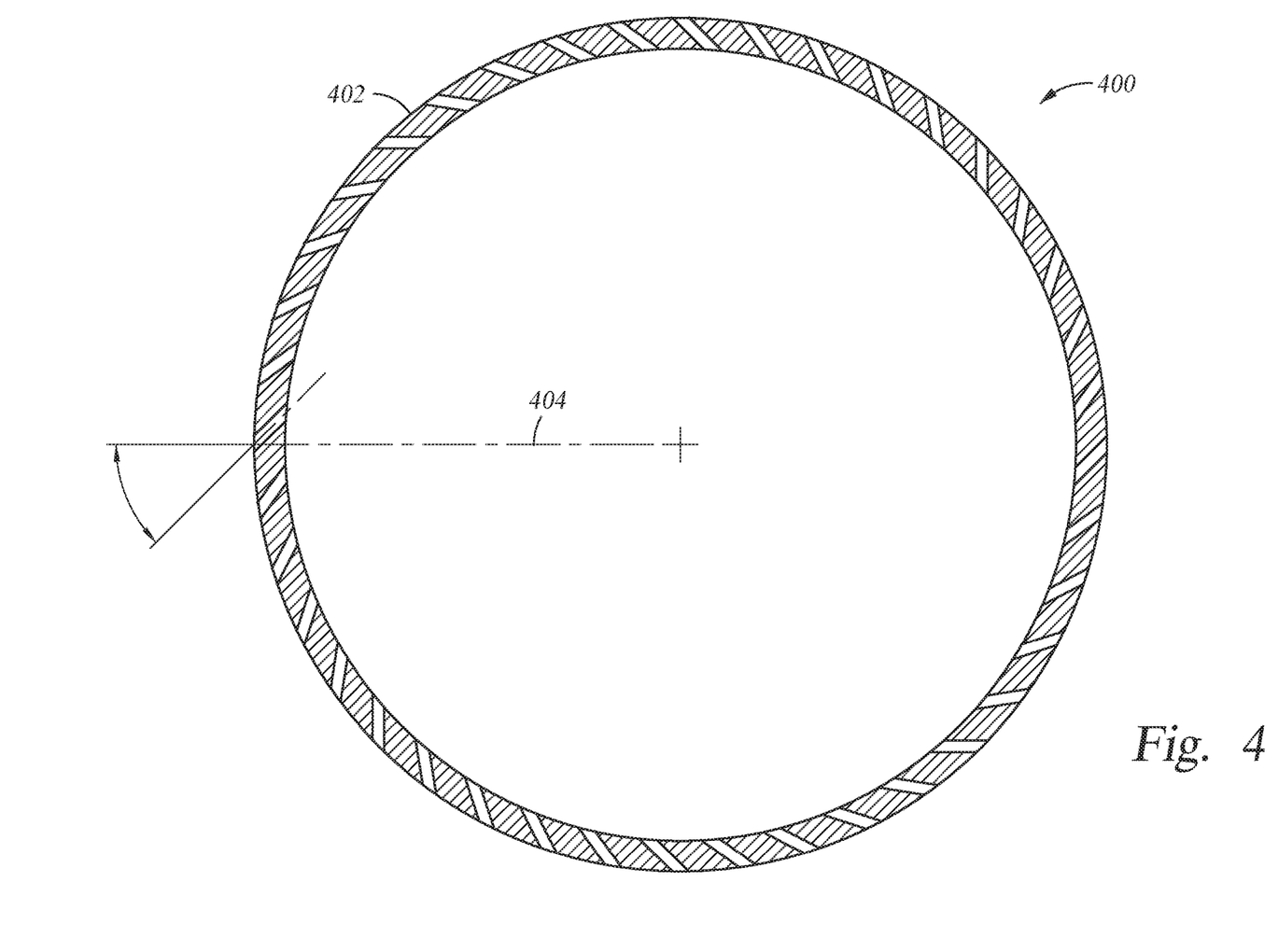
FIG. 4 is a top cross-sectional view of a gas distributor according to another embodiment.

FIG. 4 is a top cross-sectional view of a gas distributor 400 according to another embodiment. The gas distributor 400 has a plurality of passages 402 that form an angle γ with respect to a radius 404 of the gas distributor 400. The passages 402 thus provide a rotational flow to gas flowing through the gas distributor 400. If the gas distributor 400 is used in either the chamber 100 or the chamber 200 (or any chamber described herein), a rotational flow may be imparted to the gas as it enters the processing region 130 to complement, cancel, or otherwise interact with rotation of the substrate support 102 or 206. Such a flow pattern may improve processing uniformity in some cases. The angling of FIG. 4 may be combined in any desired way with the angling of FIG. 3.

Figure 5:
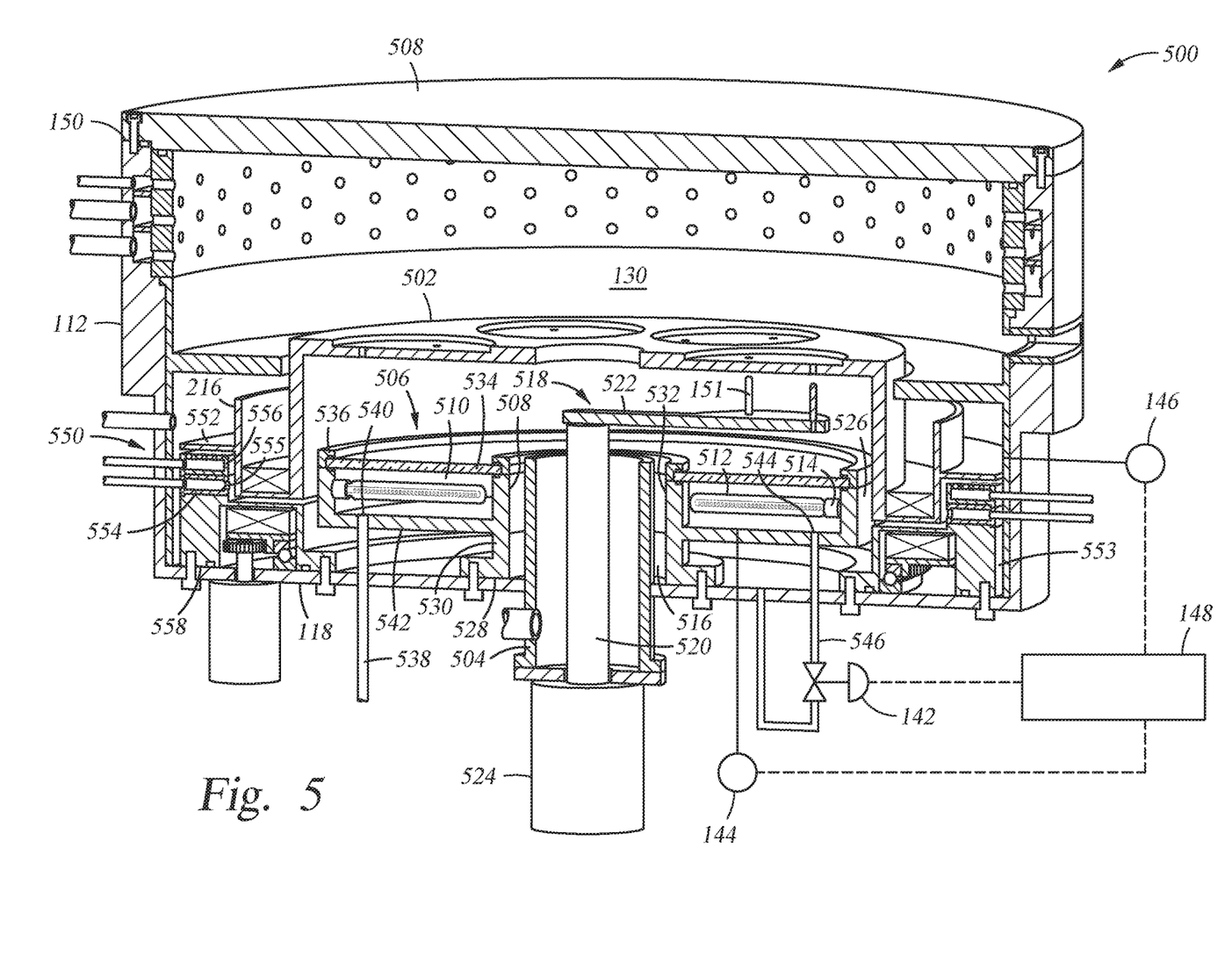
FIG. 5 is a perspective cross-sectional view of a processing chamber according to another embodiment.

FIG. 5 is a perspective cross-sectional view of a processing chamber 500 according to another embodiment. The chamber 500 is similar to the chambers 100 and 200 in many respects. The chamber 500 is a multi-substrate processing chamber with a magnetically rotatable substrate support 502 that has a central opening 108, as in the chambers 100 and 200. The chamber 500 has a central conduit 504, similar to the chamber 200. The chamber 500 differs from the chambers 100 and 200 chiefly in placement of the energy source. The chamber 500 has an energy source 506 located near the chamber bottom 118, in contrast to the chambers 100 and 200 which have energy sources coupled to the top 116 of the chambers 100 and 200. The chamber 500 features a lid 508, which is fastened to the upper end 150 of the sidewall 112.

The energy source 506 features an enclosure 508 forming an energy chamber 510 with emitters 512, which may be lamps. In the embodiment of FIG. 5, the energy source 506 is an annular member, with a central passage 516 that accommodates the central conduit 504. A lift pin assembly 518 of the chamber 500 comprises an axial support member 520 that passes through the central passage 516. In the embodiment of FIG. 5, the axial support member 520 is shown passing through the central conduit 504. In an alternate embodiment, the central conduit 504 may be disposed through a collar support of the lift pin assembly, with the collar support disposed around the central conduit 504. The axial support member 520 supports a lateral support member 522, which supports the lift pins 151. The lift pin assembly 518 may also have an actuator 524 that extends and retracts the lift pins 151 by extending and retracting the axial support member 520. Emitters 512 disposed around a periphery of the energy source 506. Power conduits (not shown) may be routed to the power connections 514 through an outer wall 526 of the energy source 506, and through the chamber bottom 118. The energy source 506 may be fastened to the chamber bottom 118, for example by a flange 528 coupled to a neck 530 that surrounds the central conduit 504. The neck 530 extends from an inner wall 532 of the energy source 506, and together with the inner wall 532 defines the central passage 518.

The energy source 506 may have a divider 534 that prevents exposure of the emitters 512 to process gases in the processing region 130. The energy chamber 510 may be sealed by seals 536, and inert gas may be flowed through the energy chamber 510 using a gas conduit 538 coupled to a portal 540 in a bottom surface 542 of the energy source 506, and passing through the chamber bottom 118 to a gas source (not shown). The gas may provide cooling for the emitters 512 and pressure control for the energy chamber 510. The gas may be exhausted through an exhaust portal 544 and exhaust conduit 546, which may have the pressure regulator 142 controlled by the controller 148 based on the pressure sensors 144 and 146, as in the chambers 100 and 200.

The chamber 500 has an air bearing 550 that is different from the air bearings of the chambers 100 and 200. In contrast to the air bearings of the chambers 100 and 200, the air bearing 550 is disposed around the outer wall 216 of the substrate support 502. A ledge 552 extends radially outward from the outer wall 216. The chamber 500 has a containment ring 558 that has an extension 554 at an outer radius 553 of the containment ring 558. The air bearing 550 is disposed on the extension 554 between the extension 554 and the ledge 552. The air bearing 550 includes a first air bearing ring 555 disposed on the extension 554, with openings at an inner radius to direct gas flow against the outer wall 216 for centering of the substrate support 502. The air bearing 550 has a second air bearing ring 556 disposed on the first air bearing ring 555, with openings in an upper surface to direct gas flow against the ledge 552. When activated, the second air bearing ring 556 creates a gas cushion between the second air bearing ring 556 and the ledge 552 to float the substrate support 502. When activated, the first air bearing ring 555 creates a gas cushion between the air bearing 550 and the outer wall 216 to center the substrate support 506.

Figure 6:
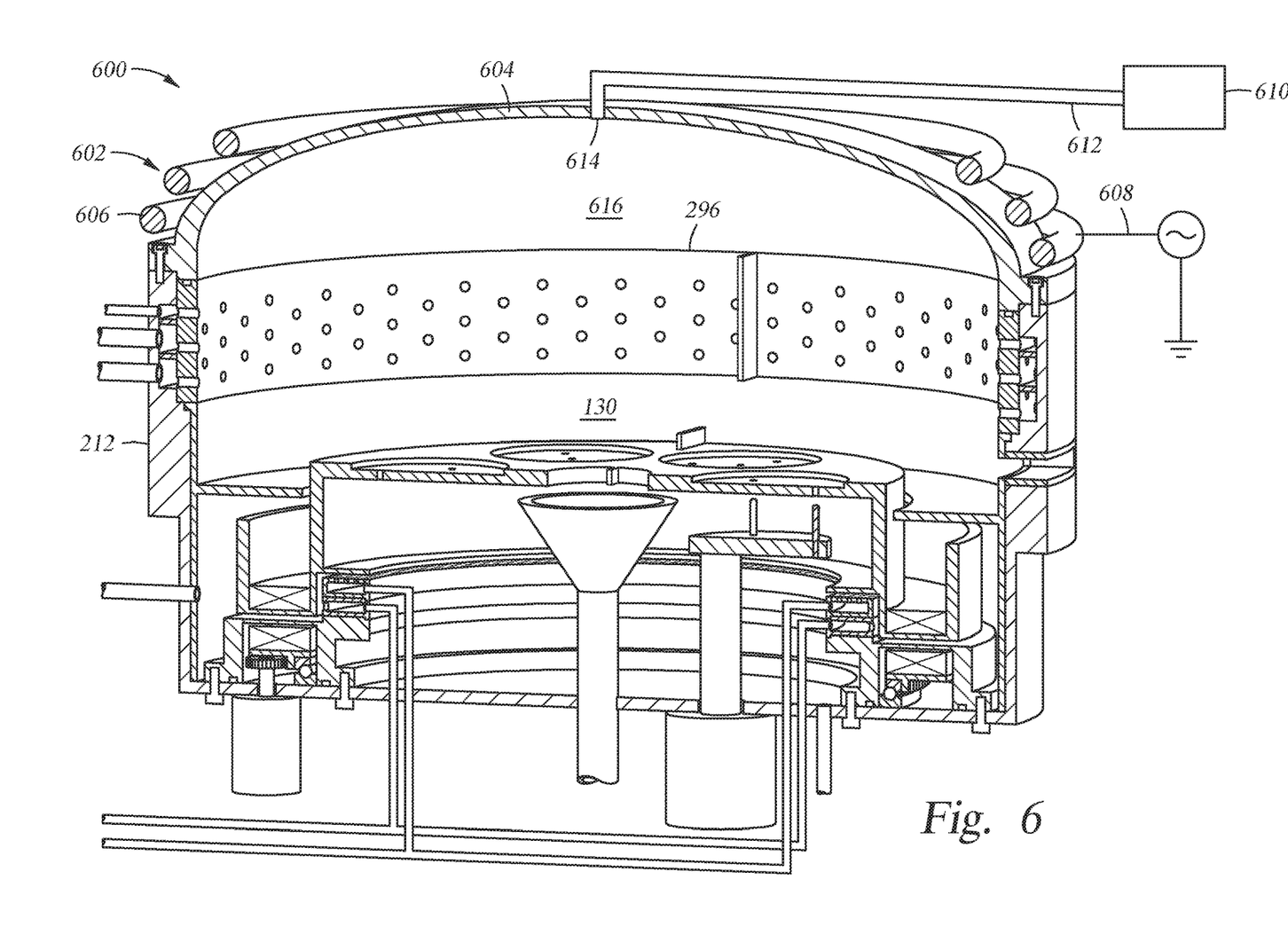
FIG. 6 is a perspective cross-sectional view of a processing chamber according to another embodiment.

FIG. 6 is a perspective cross-sectional view of a processing chamber 600 according to another embodiment. The processing chamber 600 is similar to the processing chamber 200, but with a different energy source. The chamber 600 has an inductive plasma energy source 602 coupled to a top 604 of the chamber 600. The top 604 may be a dome, and the inductive plasma energy source 602 may include a plurality of conductive coils 606 disposed around the top 604 and electrically coupled to an RF source 608. A gas source 610 may be coupled to the top 604 by a conduit 612 and a portal 614 formed in the top 604. The gas source 610 may provide a plasma gas to an energy chamber 616 inside the top 604. The conductive coils 606 may be energized to couple RF energy into the plasma gas in the energy chamber 616. A plasma may be formed in the energy chamber 616, and may be used to activate process gases in the processing region 130. Ions and electrons from the plasma may flow from the energy chamber 616 into the processing region 130 according to a pressure gradient in the chamber 600, and may interact with and activate the process gases entering the chamber 600 through the gas distributor 296. A bias member such as the bias member 129 (not shown in FIG. 6) may be included in the chamber 600, if desired, to encourage ions to flow into the processing region 130. The bias member may be a conductive grid or perforated plate, which may be coated with an insulator, and may be positioned between the top 604 and the sidewall 212.

The external surfaces of the chambers 100, 200, 500, and 600 are generally metal, such as stainless steel. Thus, the chamber body and sidewalls, bottom, and lid are generally metal. Internal surfaces of the chambers 100, 200, and 500 are generally covered, lined, or coated with thermally resistant and chemically resistant materials, such as quartz, sapphire, or a combination thereof. The substrate supports 102, 206, 502 are typically made of a high emissivity, low thermal mass material such as silicon carbide or graphite coated with silicon carbide. The dividers 127 and 534 are typically transparent or transmissive to selected wavelengths of energy, and may be made of thermally resistant and chemically resistant material such as quartz, sapphire, or a combination thereof. The other chamber internal parts, such as the containment rings 195, 213, 558, and air bearing rings 179, 236, 238, 555, and 556, may be metal, for example stainless steel, or thermally and chemically resistant if significant exposure to reactive gases is anticipated. Components inside the magnet enclosures of the containment rings may be any convenient materials. Magnets may be any known permanently magnetic materials. The chambers 100, 200, 500 and 600 as disclosed herein may increase throughput in epitaxy processes as well as other deposition processes utilizing the substrate supports and/or the gas distributors as disclosed herein.

While the foregoing is directed to certain embodiments, other and further embodiments may be devised without departing from the basic scope of this disclosure.

What is claimed is:

1. A processing chamber, comprising:
   a top, a bottom, and a sidewall coupled together to define a volume;
   a gas distributor around the sidewall, wherein the gas distributor has a plurality of gas passages distributed around a circumference thereof, and a portion of the gas passages are angled toward a top surface of the gas distributor;
   a substrate support disposed in the volume, the substrate support having a central opening, a plurality of substrate locations distributed around the central opening, and a magnetic stator, wherein each of the substrate locations includes a plurality of openings that align with lift pins;
   a pumping port positioned between the substrate support and the bottom, and within a periphery of the substrate support;
   a radiant energy source coupled to the top or the bottom; and
   a reflective plate disposed within the sidewall of the substrate support, wherein a plurality of vents are formed in the sidewall of the substrate support between the reflective plate and the substrate locations.

2. The processing chamber of claim 1, further comprising a magnetic rotor in a channel along the bottom and an air bearing between the magnetic rotor and the substrate support.

3. The processing chamber of claim 1, wherein each of the plurality of vents are in fluid communication with the central opening of the substrate support.

4. The processing chamber of claim 3, further comprising a second pumping port below the substrate support.

5. The processing chamber of claim 4, wherein the substrate support comprises a circumferential baffle extending from the magnetic stator.

6. The processing chamber of claim 1, wherein the reflective plate is positioned between the substrate support and the bottom.

* * * * *